(12) United States Patent
White et al.

(10) Patent No.: US 10,930,532 B2
(45) Date of Patent: Feb. 23, 2021

(54) OBJECT DETECTION SYSTEM

(71) Applicant: BPM MICROSYSTEMS, Houston, TX (US)

(72) Inventors: William H. White, Kentfield, CA (US); Alain Mangiat, Houston, TX (US); Rudy DeLeon, Houston, TX (US)

(73) Assignee: BPM Microsystems, Houston, TX (US)

( * ) Notice: Subject to any disclaimer, the term of this patent is extended or adjusted under 35 U.S.C. 154(b) by 276 days.

(21) Appl. No.: 15/799,159

(22) Filed: Oct. 31, 2017

(65) Prior Publication Data

US 2018/0158705 A1    Jun. 7, 2018

Related U.S. Application Data

(60) Provisional application No. 62/415,432, filed on Oct. 31, 2016.

(51) Int. Cl.
*H01L 21/67* (2006.01)
*B65G 47/91* (2006.01)
*H01L 21/683* (2006.01)
*B25J 15/06* (2006.01)
*H01L 23/00* (2006.01)

(52) U.S. Cl.
CPC .... *H01L 21/67259* (2013.01); *B25J 15/0658* (2013.01); *B65G 47/917* (2013.01); *H01L 21/67144* (2013.01); *H01L 21/6838* (2013.01); *H01L 24/75* (2013.01); *H01L 2224/75745* (2013.01); *H01L 2224/75901* (2013.01)

(58) Field of Classification Search
CPC .................................. H01L 21/67259
See application file for complete search history.

(56) References Cited

U.S. PATENT DOCUMENTS

| | | | | |
|---|---|---|---|---|
| 4,190,240 A | * | 2/1980 | Peterson | B23Q 1/38 269/21 |
| 2013/0173039 A1 | * | 7/2013 | Rowell | G05B 19/425 700/97 |
| 2015/0298316 A1 | * | 10/2015 | Accou | B25J 15/0625 414/752.1 |

* cited by examiner

*Primary Examiner* — Hyun D Park
(74) *Attorney, Agent, or Firm* — Carlson, Gaskey & Olds, P.C.

(57) ABSTRACT

An object detection system utilizes a teach cycle performed with a low-pressure blow-off (i.e. positive pressure) instead of vacuum (negative pressure). During the teach operation, the positive pressure is enabled and the nozzle is lowered to the object. An air sensor detects pressure or flow at the nozzle tip. A rise in pressure or drop in flow is detected as the nozzle makes contact with the object (i.e. just before or just after actual physical contact is made). The height of the object is stored as the taught height to be used subsequently in repetitive operations by the machine. This teaching method is particularly useful for very small objects because the positive pressure does not lift the object.

20 Claims, 10 Drawing Sheets

OBJECT DETECTION SYSTEM

BACKGROUND

Small objects are often lifted and moved using a vacuum nozzle attached to a robotic machine to perform repetitive operations. The negative pressure lifts the object and holds it against the nozzle so that it can be moved into place. However, very small objects, such as small computer or digital chips, including Wafer Level Chip Scale Packaging (WLCSP), small-outline transistors (SOT), dual-flat no-leads (DFN), etc, may be lifted by the nozzle prior to contact by the nozzle with the object. The vacuum may cause the object to "jump" up to the nozzle.

Before the machine can begin repetitive operations, the machine must be taught the height of the object. During a teaching cycle, when the height of the object is being learned by the robot/machinery that moves the nozzle, the jump by the object causes the height to be measured incorrectly. Subsequently during repetitive operations, this incorrect height causes the machine to attempt to pick up the object before making contact. This may lead to pick and place errors, dropped parts, cracked parts, continuity errors, etc.

SUMMARY

In the object detection system disclosed herein, the teach cycle is performed using a low-pressure blow-off (i.e. positive pressure) instead of vacuum (negative pressure). During the teach operation, the positive pressure is enabled and the nozzle is lowered to the object. An air sensor detects pressure or flow at the nozzle tip. A rise in pressure or drop in flow is detected as the nozzle makes contact with the object (i.e. "contact" here includes just before or just after actual physical contact is made).

The height of the object is stored as the taught height to be used subsequently in repetitive operations by the machine. This teaching method can be used for any size device, but is particularly useful for very small objects. The positive pressure does not lift the object.

The detection algorithm may self-calibrate to eliminate the need for manual adjustments to compensate for variations in atmospheric pressure, nozzle size, flow rates, filter conditions, etc. The self-calibrating algorithm can be used with either a positive or negative pressure teaching methodology.

DETAILED DESCRIPTION

Figure 1:
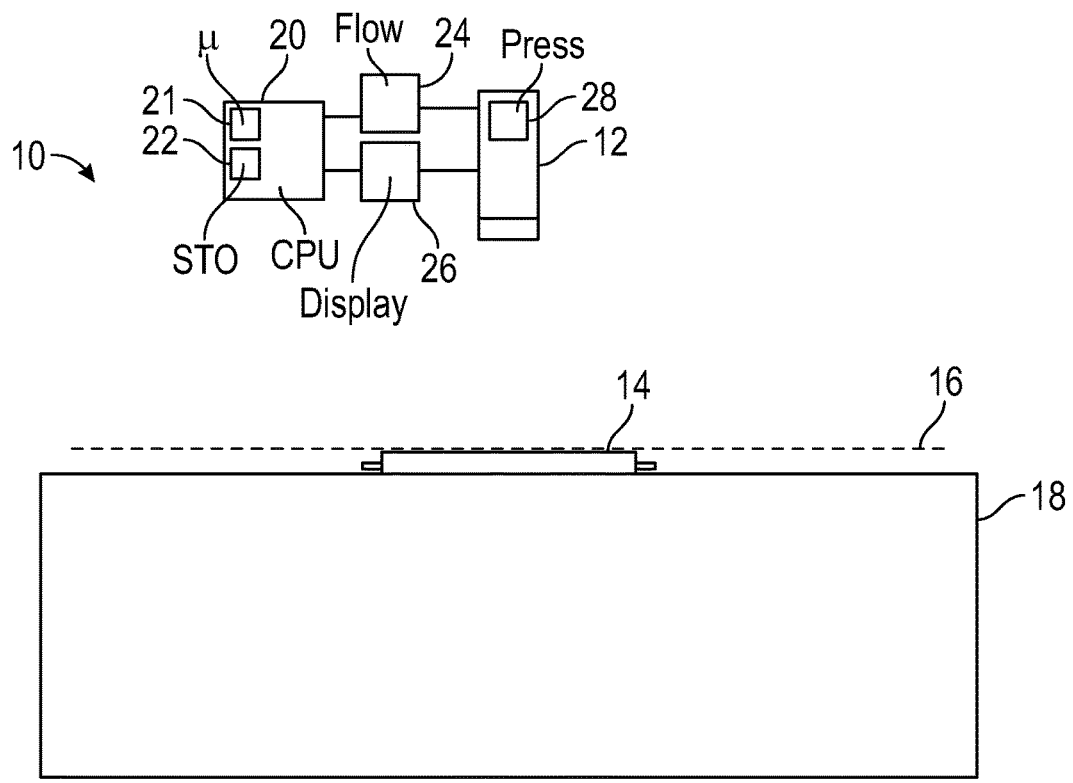
FIG. 1 is a schematic of an object detection system according to a first embodiment.

An object detection system 10 is shown in FIG. 1. The object detection system 10 is incorporated into a pick and place system and includes a nozzle 12 for picking and placing objects, such as object 14, having an upper surface at a height 16 on a work surface 18. Although the system 10 may be used for larger objects, it is particularly useful for very small objects, such as Wafer Level Chip Scale Packaging (WLCSP), small-outline transistors (SOT), dual-flat no-leads (DFN), and the like, which may have an upper surface that is approximately 3 mm by 3 mm or less and a thickness of 0.4 mm or less.

The object detection system 10 further includes a computer 20 having a processor 21 executing instructions stored in computer storage 22 to perform the algorithms and other steps described herein. The computer 20 controls the flow of air through the nozzle 12 (positive and negative pressure, as will be explained) by controlling a flow device 24, such as a valve, a needle valve, pump, ejector pump, fan, etc. The displacement of the nozzle 12 vertically and horizontally is effectuated by a displacement device 26, such as one or more motors, stepper motor with a lead screw, hydraulics, robots, etc, which is controlled precisely by the computer 20. An air sensor 28, which could be a pressure sensor or an air flow sensor, is in (or in fluid communication with) the nozzle 12 and measures air pressure or flow in the nozzle 12. In the illustrated examples below, the air sensor 28 is a pressure sensor generating a voltage which decreases as the measured pressure increases. Other types of sensors could be used.

Figure 2:
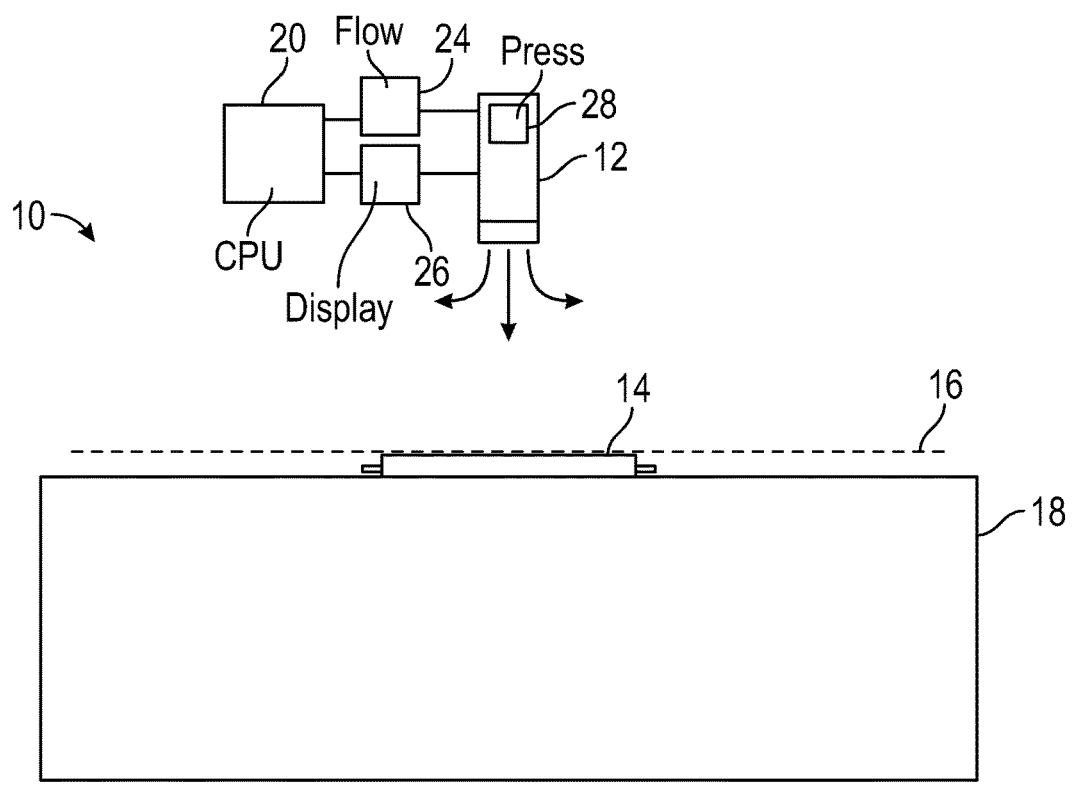
FIG. 2 shows the object detection system with the nozzle beginning to move toward the object during a learning mode.

Generally, as shown in FIG. 2, the object detection system 10 first learns the height 16 of the upper surface of the object 14. The computer 20 causes the flow device 24 to send positive pressure out through the nozzle 12 and causes the displacement device 26 to move the nozzle 12 toward the object 14.

Figure 3:
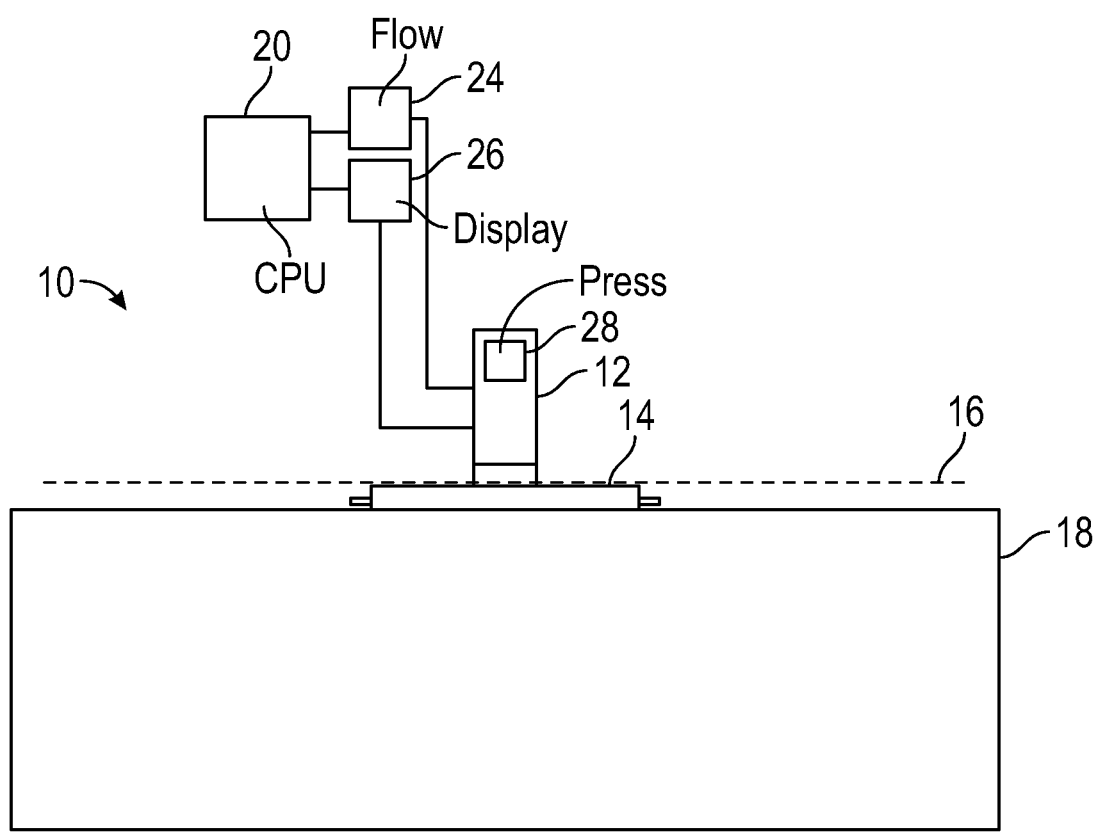
FIG. 3 shows the object detection system with the nozzle at the point where the upper surface of the object is detected in the learning mode.

As shown in FIG. 3, as the nozzle 12 contacts upper surface of the object 14 (again, meaning in the range of just before to just after physical contact is made), the air sensor 28 detects the change in air pressure or flow rate in the nozzle 12 or flow device 24. The computer 20 receives the pressure change measurement from air sensor 28 and determines that the object was contacted (or very nearly contacted). The height of the nozzle 12 at the point the upper surface is detected is recorded by computer 20. This learning cycle may be performed several times and the height calculations may be averaged.

After the height 16 of the upper surface of the object 14 is determined, the nozzle 12 may be used to pick and place the object 14. The nozzle 12 is moved to the learned height to pick up the object 14 with negative pressure (vacuum) in the nozzle 12. The nozzle 12 lifts and moves the object 14 and releases the object 14 by changing to a neutral or positive pressure (as controlled by computer 20). Optionally, the machine may have multiple nozzles used to pick and place objects or the machine may use a different nozzle to pick and place objects from the nozzle 12 that was used to learn the height of the object.

Figure 4:
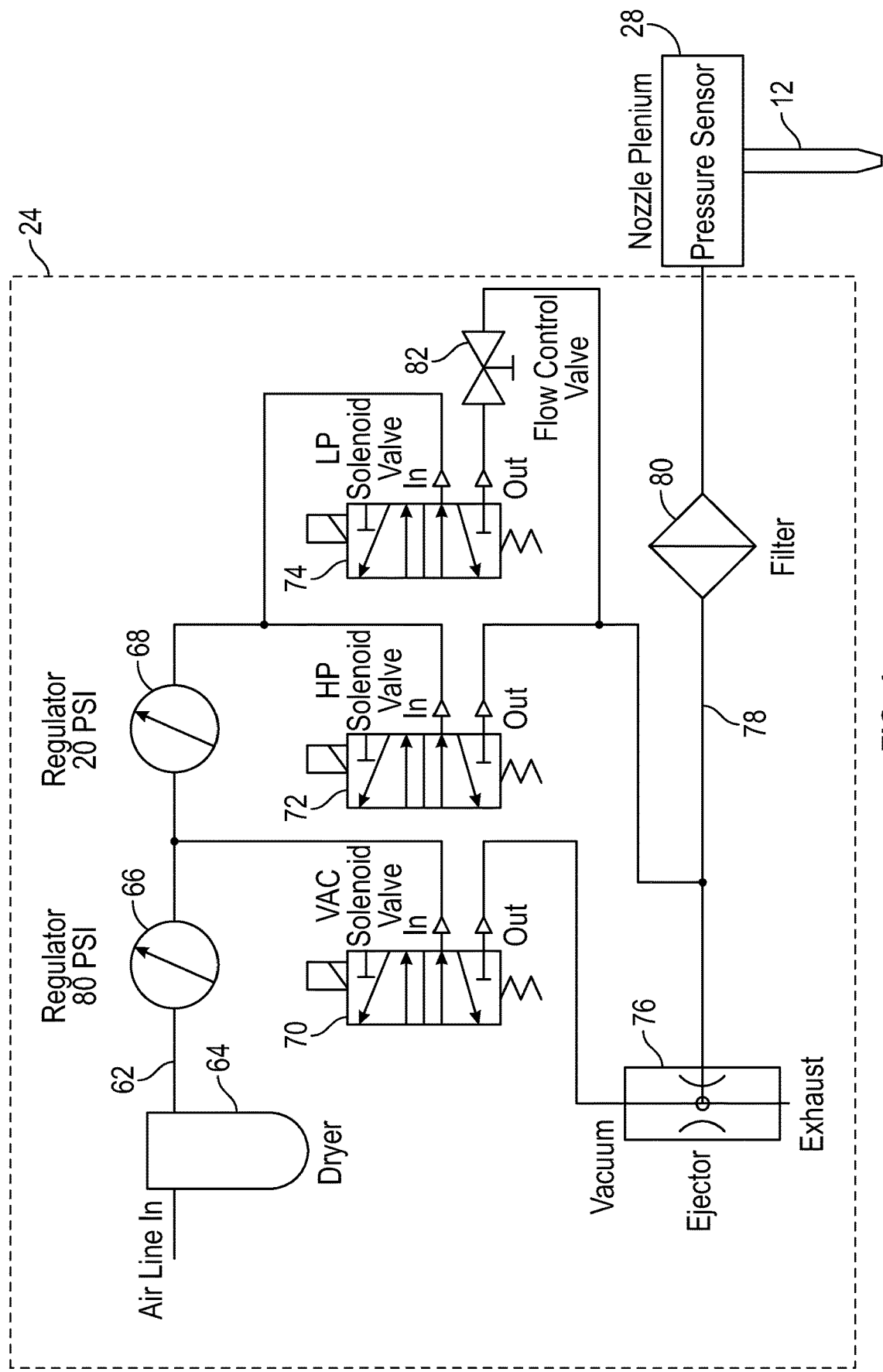
FIG. 4 is a schematic of one example flow device that could be used in the detection system of FIG. 1.

FIG. 4 is a schematic of one example flow device 24 that could be used in the detection system of FIG. 1. The example flow device 24 includes a pressurized air supply 62 passing through a dryer 64 to a first regulator 66 and a second regulator 68. The first regulator 66 provides air at first predetermined pressure (e.g. 80 psi) and the second regulator 68 provides air at a second, lower predetermined pressure (e.g. 20 psi). The air from the first regulator 66 is provided to a first solenoid valve 70 (or vacuum solenoid valve 70). The air from the second regulator 68 is provided to a second solenoid valve 72 (or high pressure solenoid valve 72) and to a third solenoid valve 74 (or low pressure solenoid valve 74) in parallel with the high pressure solenoid valve 72.

When activated (opened), such as by computer 20 (FIG. 1), the air from the vacuum solenoid valve 70 supplies an ejector pump 76, which as is known, may include a venturi for creating a vacuum on feed line 78, which is fluidly connected to nozzle 12 via a filter 80. This vacuum is used to selectively lift objects 14 with the nozzle 12.

When activated (opened), such as by computer 20 (FIG. 1), the high pressure solenoid valve 72 supplies blow-off positive pressure to the feed line 78. In this example, the higher pressure solenoid valve 72 provides 20 psi to feed line 78 (e.g. to place the object and separate the object 14 from the nozzle 12).

When activated (opened), such as by computer 20 (FIG. 1), the low pressure solenoid valve 74 supplies low positive pressure (e.g. 20 psi) to the feed line 78, as controlled by a flow control valve 82 (which may be a needle valve). The flow control valve 82 supplies low flow, low pressure, positive pressure air to the feed line 78. It is this low positive pressure that is used for object detection in the algorithms described below.

Two example algorithms for making the determination that the nozzle 12 has detected the object 14 in the learning cycle are disclosed below.

Figure 5:
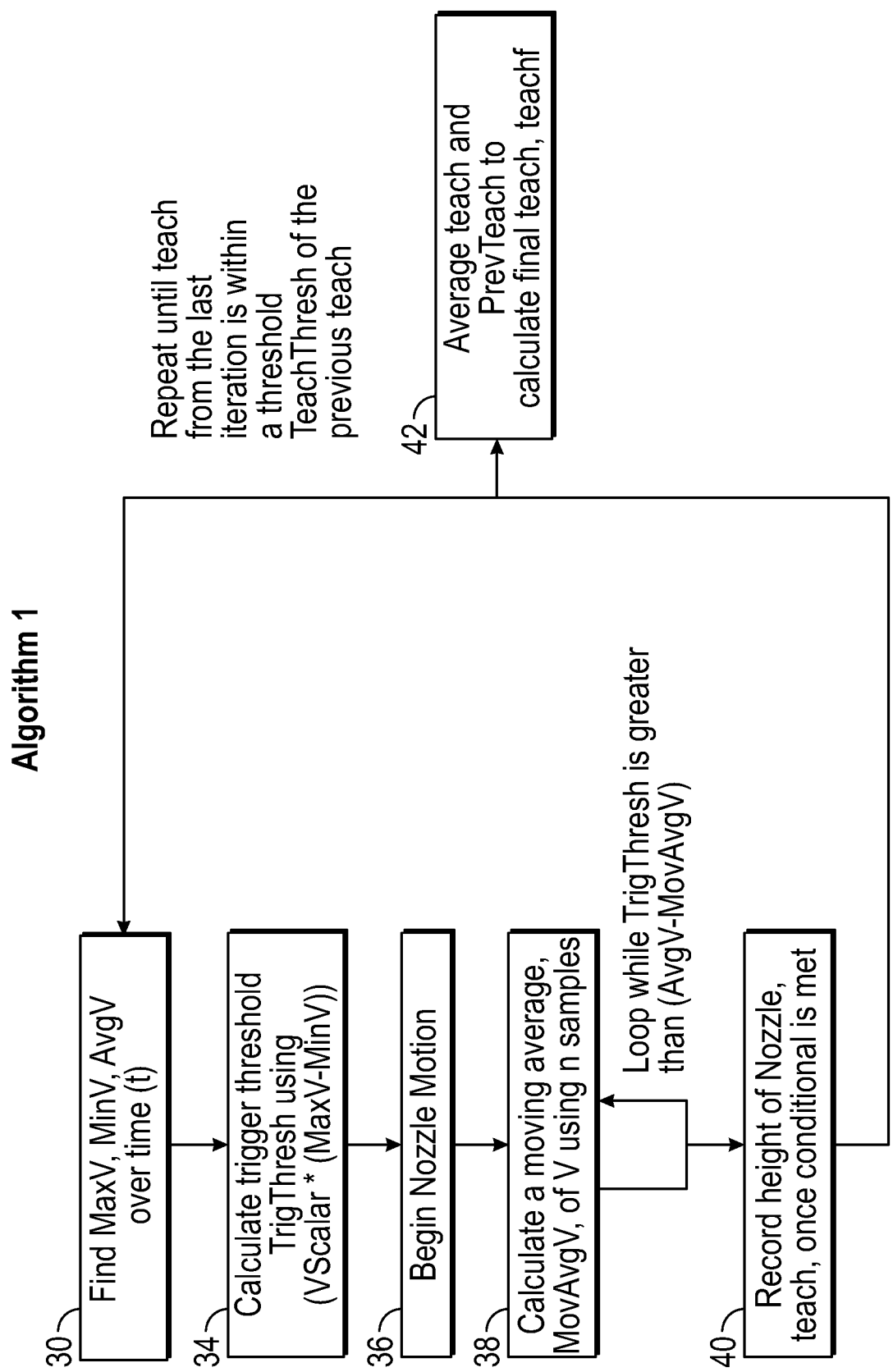
FIG. 5 is a flowchart illustrating a first method that could be used to detect the object using the system of FIGS. 1-4.
Figure 6:
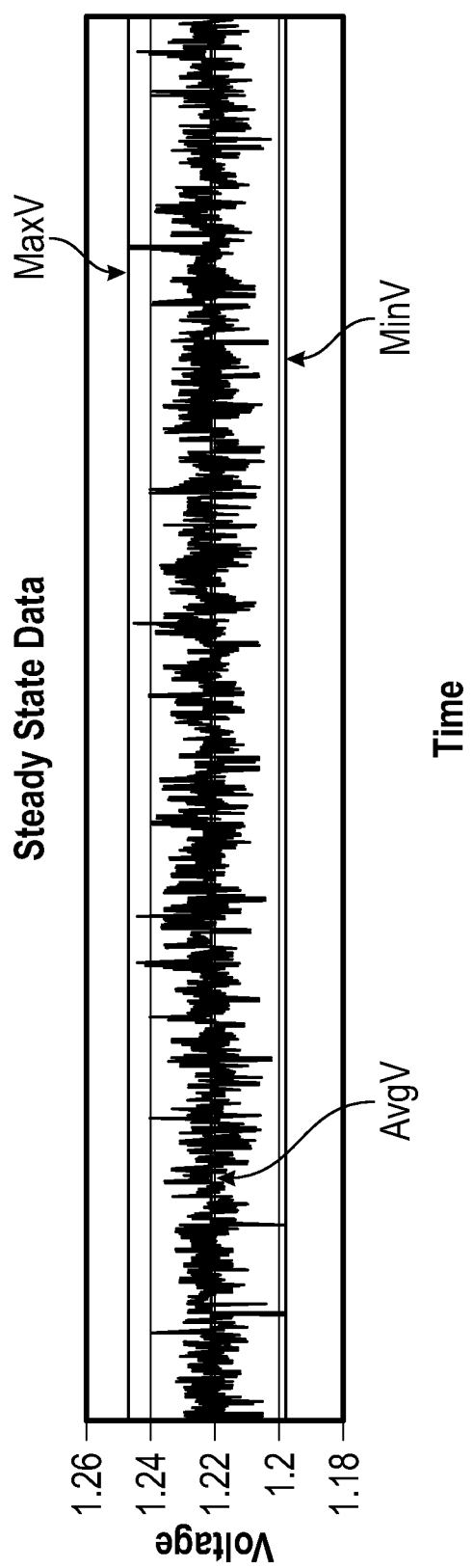
FIG. 6 is a graph of measured pressure in the nozzle at steady state.

FIGS. 5-9 illustrate a first algorithm for detecting the object. In step 30 of the flowchart in FIG. 5, the nozzle 12 is spaced above the object 14 and the nozzle 12 has positive pressure. As shown in FIG. 6, the pressure in the nozzle 12 is measured repeatedly. Once steady state is achieved, the maximum pressure over that time period is recorded as MaxV. The minimum pressure over that time period is recorded as MinV. The average of pressure readings over the time period is recorded as AvgV.

Figure 7:
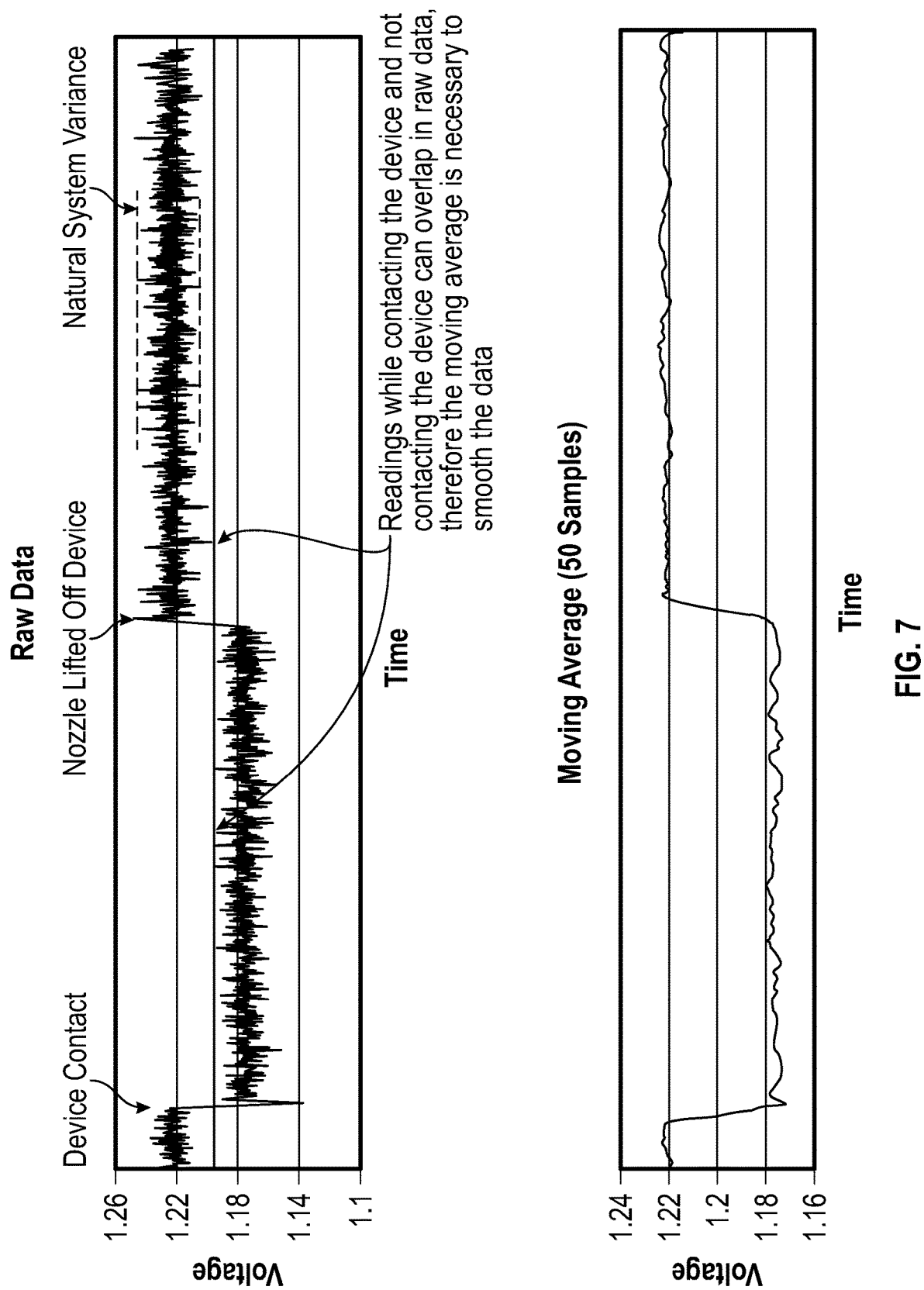
FIG. 7 is a graph of measured pressure in the nozzle and the moving average of the pressure in the nozzle as the nozzle contacts and then breaks contact with the object.

Referring to the upper graph of FIG. 7, it can be seen that the fluctuation in raw data is sufficiently large that some readings while the nozzle 12 contacts the object 14 may overlap some readings while the nozzle 12 does not contact the object 14. Therefore, in the example embodiment, the moving average, rather than the raw data, is compared to a threshold. The bottom graph of FIG. 7 shows a moving average of the raw data in the upper graph.

Figure 8:
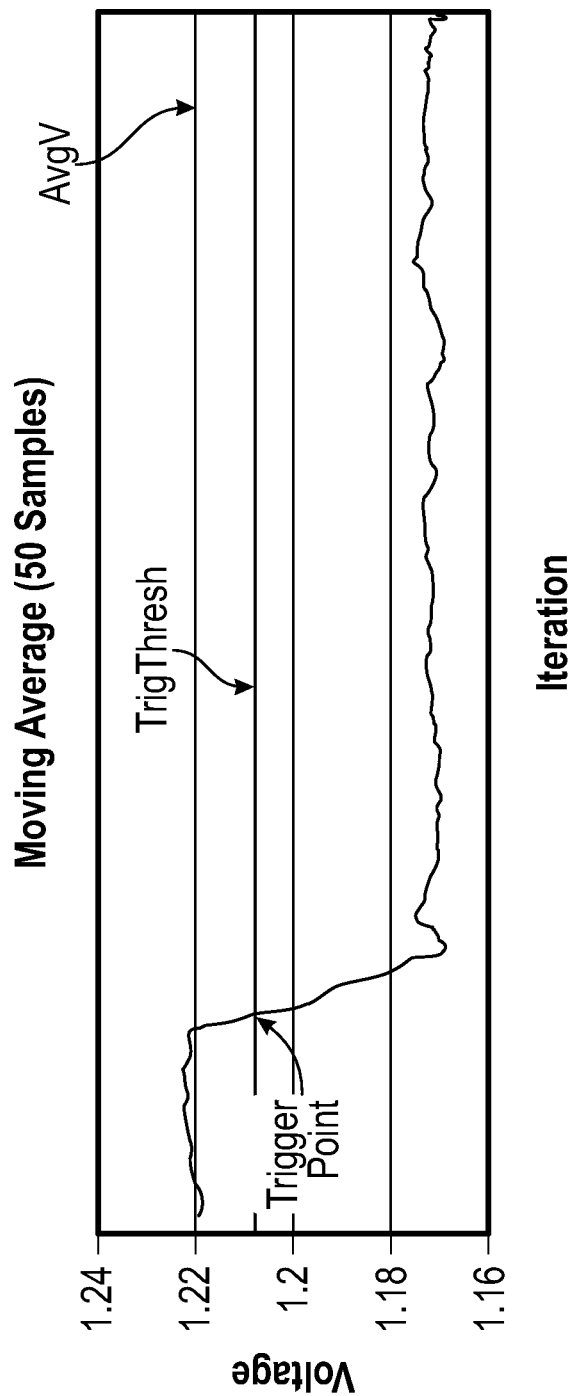
FIG. 8 is a graph of the moving average of the pressure in the nozzle as the nozzle contacts the object.

FIG. 8 shows the first portion of the moving average of FIG. 7, compared to the average (AvgV) and the trigger threshold (TrigThresh). The trigger threshold in this example is calculated as one half the difference of MaxV−MinV, although other trigger thresholds could be used successfully depending upon the specific implementation.

Again referring to the flowchart of FIG. 5, the nozzle 12 is then moved toward the object 14 in step 36 (as controlled by computer 20 and displacement device 26). The computer 20 continues to calculate a moving average MovAvgV of pressure samples using the last 50 samples in step 38 (a different number of samples could be used depending upon the rate at which the nozzle moves, expected fluctuations in the raw data, desired accuracy, etc). As long as TrigThresh is less than MovAvgV, the nozzle 12 is moved toward the object 14.

Figure 9:
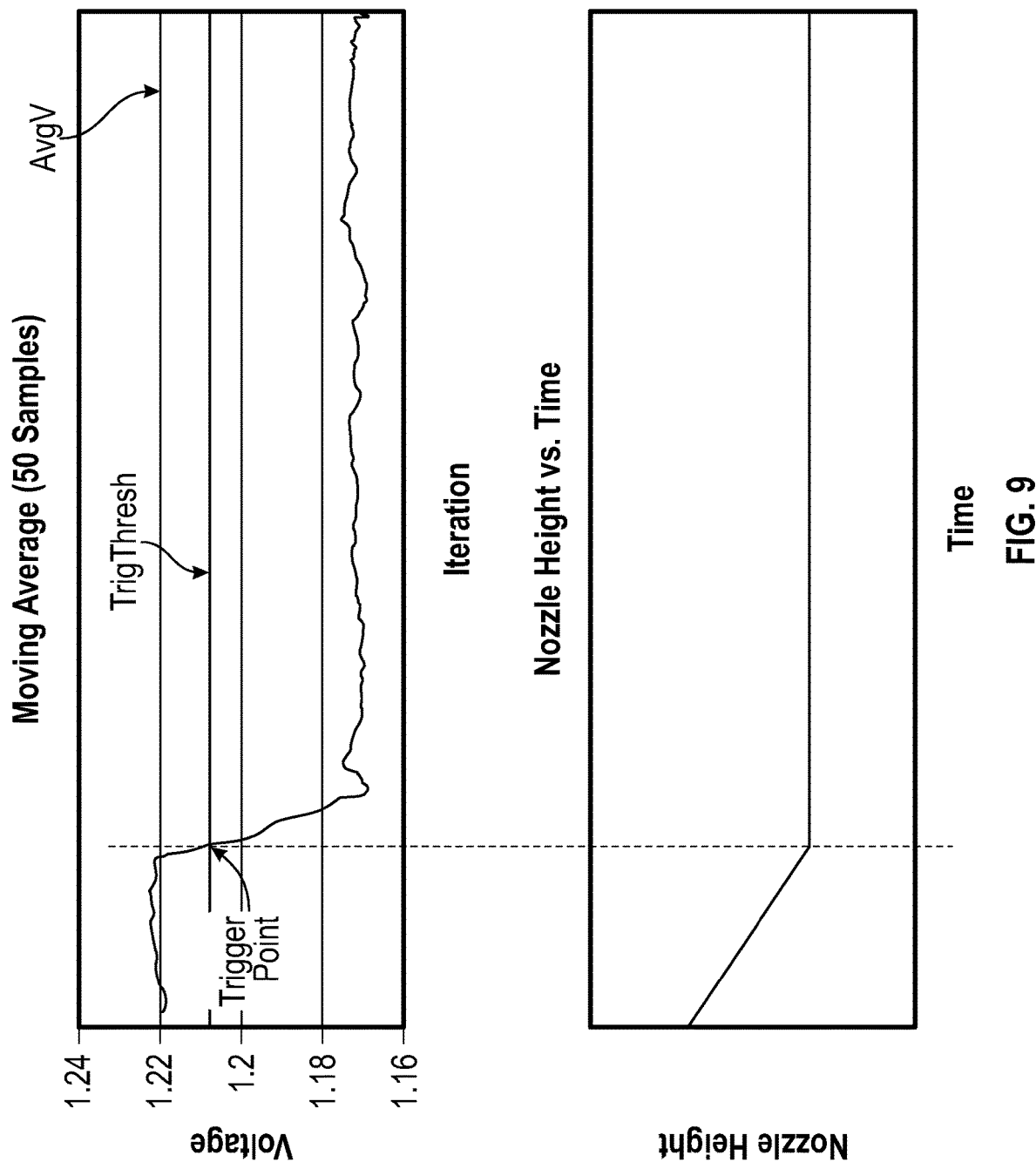
FIG. 9 shows the moving average graph of FIG. 8 along with a graph of displacement of the nozzle over time.

As the nozzle 12 contacts the upper surface of the object 14 (FIG. 3), the pressure in the nozzle 12 rises (and flow drops) and the voltage from air sensor 28 drops, as shown at "device contact" in FIG. 7. The moving average, MovAvgV, then differs from the average by more than the trigger threshold as shown in FIG. 8, and the height of the nozzle 12 is recorded in step 40 (FIG. 5). The nozzle 12 is then lifted from the object 14 ("nozzle lifted off device" in FIG. 7) and steps 30-40 may be repeated to confirm the height has been taught with a precision better than a threshold. Sequential height calculations may be averaged in step 42 to calculate a final height (teachf). FIG. 9 shows the moving average graph of FIG. 8 along with a graph of displacement of the nozzle 12 over time.

Figure 10:
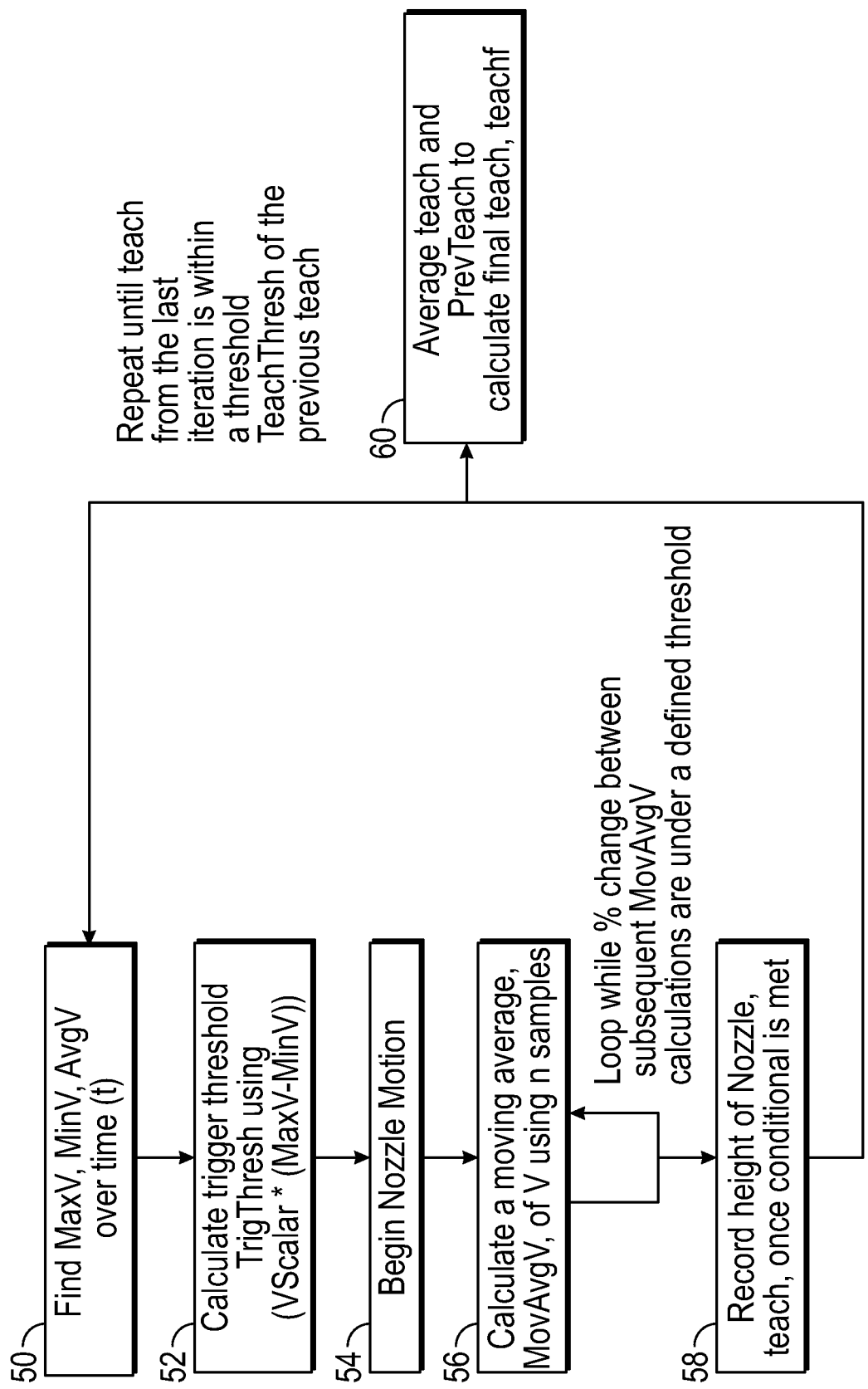
FIG. 10 is a flowchart of a second method that can be used to detect the object using the system of FIGS. 1-4.
Figure 11:
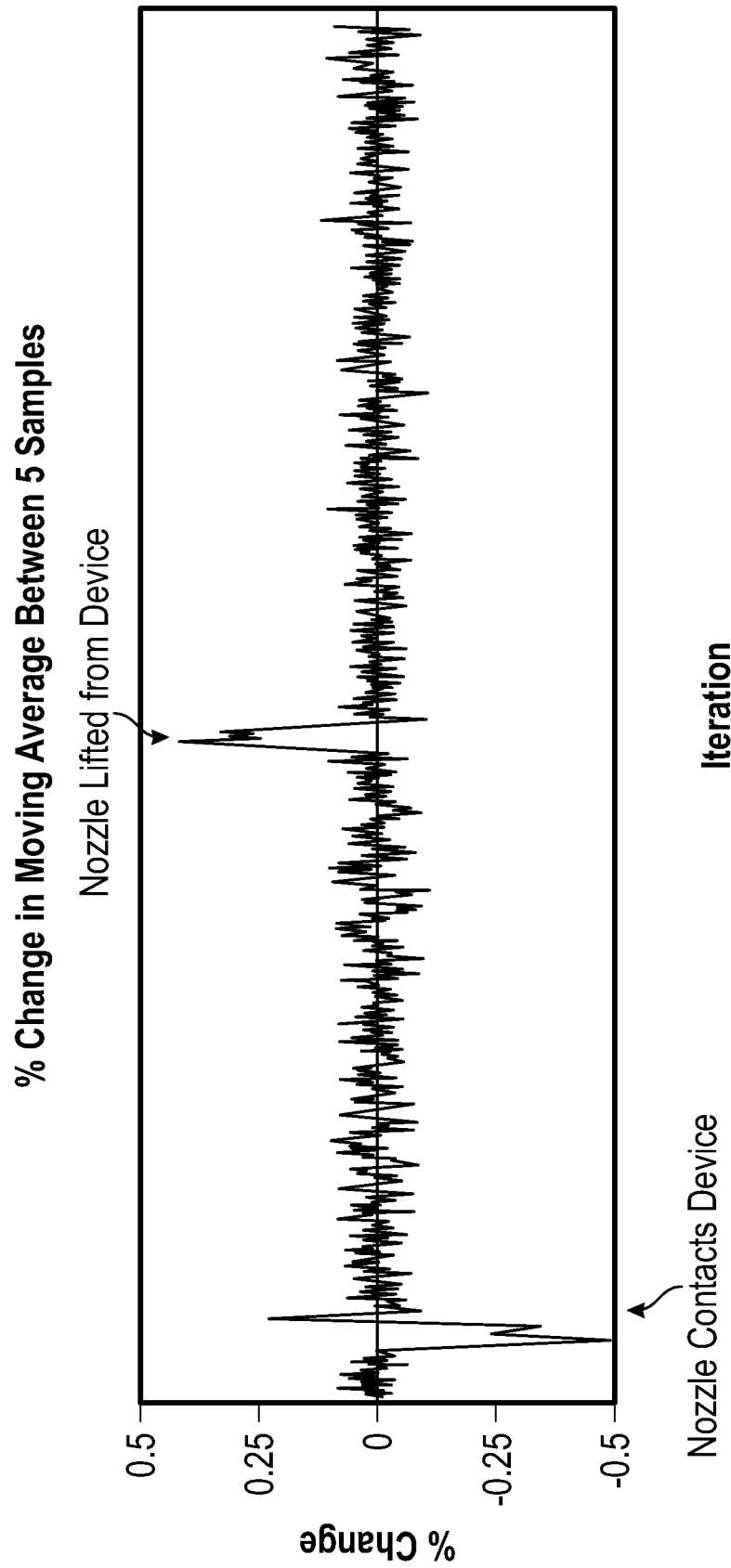
FIG. 11 is a graph of the percent change in the moving average of the nozzle pressure as the nozzle contacts the object using the method of FIG. 10.

An alternative, second algorithm is shown in FIGS. 10-11. FIG. 10 is a flowchart of the second algorithm. FIG. 11 is a graph of the percent change in the moving average (MovAvgV), as calculated over the trailing five samples. In step 50, the nozzle 12 is spaced above the object 14 and the nozzle 12 has positive pressure. As shown to the left of FIG. 12, the moving average of the pressure in the nozzle 12 fluctuates but not significantly, as the % change of moving average is low. In step 52, TrigThresh is calculated, such as by using VScalar*(MaxV−MinV), although other formulas could be used to calculate the threshold.

The nozzle 12 is moved toward the object 14 in step 54 (as controlled by computer 20 and displacement device 26). The computer 20 continues to calculate a moving average MovAvgV of V using n samples in step 56. As long as the % change between subsequent calculations of MovAvgV are below a threshold, the nozzle 12 is moved toward the object 14. This can be calculated as follows:

n=iteration

If MovAvgV(n) does not equal 0 & iteration>4

Then % change=((MovAvgV($n$)−MovAvgV($n$−5))/ MovAvgV($n$−5))*100

As the nozzle 12 contacts the upper surface of the object 14 (FIG. 3), the pressure in the nozzle 12 spikes and the voltage from air sensor 28 drops, as shown at "device contact" in FIG. 7. The absolute value of the % change in subsequent calculations of the moving average then spikes as shown in FIG. 7. As the % change exceeds a threshold, the height of the nozzle 12 is recorded in step 58. The nozzle 12 is then lifted from the object 14 and steps 50-58 may be repeated until the calculated height is within a threshold of the immediately previous calculated threshold, in which case the two calculated heights are averaged together and stored as the final height in step 60.

Although two specific algorithms are disclosed, other algorithms could be used to detect the spike in pressure as the nozzle 12 contacts the object 14. The disclosed system 10 eliminates the object jump caused by the vacuum in previous systems. Because of this, it is significantly more accurate than previous systems and is easier for operators to use, requiring less training and allowing teaching to be performed in less time without manual intervention. The improved accuracy of the height calculation will improve the yield of the machine.

In accordance with the provisions of the patent statutes and jurisprudence, exemplary configurations described above are considered to represent a preferred embodiment of the invention. However, it should be noted that the invention can be practiced otherwise than as specifically illustrated and described without departing from its spirit or scope.

What is claimed is:

1. A pick and place system comprising:
a nozzle configured to supply positive pressure and positive flow, the nozzle movable toward an object;
a sensor configured to detect at least one of the flow or the pressure of the nozzle while the nozzle is supplying positive pressure and positive flow; and
a processor configured to receive an indication from the sensor of the at least one of the flow or the pressure of the nozzle and configured to control movement of the nozzle toward and away from the object, the processor configured to determine a threshold based only upon a maximum steady state flow and a minimum steady state flow of the nozzle or based only upon a maximum steady state pressure and a minimum steady state pressure of the nozzle, the processor configured to determine the location of the object based upon a change in the at least one of the flow or the pressure of the nozzle relative to the threshold while the nozzle is supplying positive pressure and positive flow.

2. The object detection system of claim 1 wherein the nozzle is configured to supply positive pressure and positive flow of air.

3. The object detection system of claim 2 wherein the pick and place system is configured for picking and placing objects having an upper surface that is approximately 3 mm by 3 mm or less.

4. The object detection system of claim 2 further including a displacement device configured to move the nozzle toward and away from the object.

5. The object detection system of claim 2 further including a motor configured to move the nozzle toward and away from the object.

6. The object detection system of claim 5 wherein the sensor is a pressure sensor.

7. The object detection system of claim 6 wherein the nozzle is configured to supply positive pressure and positive flow of air, and wherein the pressure sensor is an air pressure sensor.

8. The object detection system of claim 7 further including a pressurized air supply supplying pressurized air to a first regulator providing air at a first positive pressure and the pressurized air supply supplying pressurized air to a second regulator supplying air at a second positive pressure lower than the first positive pressure, wherein the first regulator supplies air at the first positive pressure to a ejector pump for selectively providing negative pressure to the nozzle for picking and placing objects, and wherein the second regulator supplies positive pressure to the nozzle.

9. The system of claim 1 wherein the threshold is based upon an average of the pressure or flow of the fluid supply prior to contact of the nozzle with the object.

10. A pick and place system comprising:
a nozzle configured to supply positive air flow and negative air flow;
a displacement device configured to move the nozzle toward an object;
a sensor configured to measure at least one of air flow or air pressure of the nozzle; and
a processor configured to receive an indication from the sensor of the at least one of the flow or the pressure of the nozzle and configured to control the displacement device to move the nozzle toward the object, the processor configured to determine a threshold based upon a difference between a maximum steady state flow and a minimum steady state flow of the nozzle or based upon a difference between a maximum steady state pressure and a minimum steady state pressure of the nozzle, the processor configured to determine the location of the object based upon a change in the at least one of the air flow or the air pressure of the nozzle relative to the threshold while the nozzle is supplying positive pressure and positive flow.

11. The pick and place system of claim 8 wherein the processor is configured to determine the location of the object in a learning cycle and then to pick and place a plurality of similar objects using the nozzle based upon the determined location of the object.

12. The pick and place system of claim 11 wherein the plurality of similar objects each have an upper surface that is approximately 3 mm by 3 mm or less.

13. The pick and place system of claim 11 wherein the plurality of similar objects are digital chips.

14. A method for calibrating a pick and place system including the steps of:
a) moving a nozzle toward an object;
b) supplying fluid out of the nozzle toward the object;
c) during said step b), determining a threshold based upon a difference between a maximum steady state pressure and a minimum steady state pressure or based upon a difference between a maximum steady state flow and a minimum steady state flow of the fluid supply;
d) detecting a change in the fluid supply as the nozzle contacts the object based upon a comparison of the pressure or flow of the fluid supply to the threshold; and
e) storing the location of the nozzle based upon said step d).

15. The method of claim 14 wherein the fluid is air.

16. The method of claim 14 wherein said step c) includes the step of measuring pressure of the fluid and detecting a change in the pressure as the nozzle contacts the object.

17. A method for picking and placing a plurality of objects including calibrating a location of the object according to the method of claim 14, and further including the subsequent iterative steps of moving the nozzle to the stored location and supplying negative pressure at the nozzle to pick each of the plurality of objects, moving the nozzle and each of the objects and placing each of the objects by supplying neutral or positive pressure to the nozzle.

18. The method of claim 14 wherein the threshold is based upon an average of the pressure or flow of the fluid supply prior to contact of the nozzle with the object.

19. The method of claim 14 wherein the threshold is based upon a moving average of the pressure or flow of the fluid supply.

20. The method of claim 19 wherein the detection in step d) includes monitoring a percentage change in the moving average.

* * * * *

UNITED STATES PATENT AND TRADEMARK OFFICE
CERTIFICATE OF CORRECTION

PATENT NO. : 10,930,532 B2  Page 1 of 1
APPLICATION NO. : 15/799159
DATED : February 23, 2021
INVENTOR(S) : William H. White, Alain Mangat and Rudy DeLeon It is certified that error appears in the above-identified patent and that said Letters Patent is hereby corrected as shown below:

In the Claims

In Claim 2, Column 5, Line 27; replace "The object detection system" with --The system--

In Claim 3, Column 5, Line 30; replace "The object detection system" with --The system--

In Claim 4, Column 5, Line 34; replace "The object detection system" with --The system--

In Claim 5, Column 5, Line 37; replace "The object detection system" with --The system--

In Claim 6, Column 5, Line 40; replace "The object detection system" with --The system--

In Claim 7, Column 5, Line 42; replace "The object detection system" with --The system--

In Claim 8, Column 5, Line 46; replace "The object detection system" with --The system--

In Claim 9, Column 5, Line 57; replace "the fluid supply" with --a fluid supply--

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*